United States Patent
Michel et al.

[11] Patent Number: 6,028,470
[45] Date of Patent: Feb. 22, 2000

[54] INTEGRATED CIRCUIT FOR CURRENT CONTROL OF A POWER TRANSISTOR

[75] Inventors: Hartmut Michel, Reutlingen; Christian Pluntke, Hechingen, both of Germany

[73] Assignee: Robert Bosch GmbH, Stuttgart, Germany

[21] Appl. No.: 08/930,669

[22] PCT Filed: Apr. 20, 1996

[86] PCT No.: PCT/DE96/00689

§ 371 Date: Oct. 14, 1997

§ 102(e) Date: Oct. 14, 1997

[87] PCT Pub. No.: WO96/37955

PCT Pub. Date: Nov. 28, 1996

[30] Foreign Application Priority Data

May 27, 1995 [DE] Germany ............... 195 19 477

[51] Int. Cl.[7] .......................... H03K 17/14; H02H 7/20
[52] U.S. Cl. .................. 327/378; 327/362; 327/513; 361/57; 361/106
[58] Field of Search .................. 327/362, 378, 327/512, 513, 483; 361/18, 58, 57, 56, 103, 106; 323/907, 289

[56] References Cited

U.S. PATENT DOCUMENTS

| | | |
|---|---|---|
| 3,583,224 | 6/1971 | Futaki .................... 327/512 |
| 3,596,115 | 7/1971 | Conzelmann ............. 327/575 |
| 3,889,137 | 6/1975 | Kay ........................ 327/482 |
| 4,360,852 | 11/1982 | Gilmore .................. 361/18 |
| 4,378,580 | 3/1983 | Stich ....................... 361/91 |
| 4,652,144 | 3/1987 | Gunther et al. .......... 327/512 |
| 4,789,819 | 12/1988 | Nelson .................... 323/907 |
| 5,841,312 | 11/1998 | Mindl et al. ............. 327/378 |
| 5,847,436 | 12/1998 | Iwata ...................... 257/467 |

FOREIGN PATENT DOCUMENTS

| | | | |
|---|---|---|---|
| 228 835 | 10/1985 | German Dem. Rep. | C23C 18/30 |
| 2 234 112 | 1/1991 | United Kingdom | H03K 17/08 |

OTHER PUBLICATIONS

Tietze & Schenk, Electronic Circuits Design and Applications, pp. 520–524, 1991 (9th Edition).

Primary Examiner—Timothy P. Callahan
Assistant Examiner—Terry L. Englund
Attorney, Agent, or Firm—Kenyon & Kenyon

[57] ABSTRACT

An integrated circuit comprising a power transistor and a circuit arrangement. The circuit arrangement is thermally coupled to the power transistor and operates in a temperature-dependent fashion. The integrated circuit includes a pnp or npn transistor with a temperature dependent resistor coupled between the base and emitter of the transistor. The off-state current of the transistor changes as a function of temperature and initiates a change in a base current of the power transistor.

14 Claims, 5 Drawing Sheets

INTEGRATED CIRCUIT FOR CURRENT CONTROL OF A POWER TRANSISTOR

BACKGROUND OF THE INVENTION

It is known to dimension semiconductor components, in particular power transistors, in such a way that their activatable power greatly exceeds the ordinarily permissible continuous demands and the continuous losses which thereby occur. The semiconductor elements can thus be produced more economically, since they do not need to be designed for continuous operation at the activatable power. It is known to associate with the semiconductor components protective circuits which can be activated as a function of a component temperature of the component, so that damage to the components due to extended continuous load—for which they are not designed—can be prevented.

Known for this purpose are circuit arrangements in which the semiconductor component is switched off when a limit temperature is exceeded. The power transistor is switched off, in this context, by means of a measurement of forward voltage or off-state current at integrated sensor elements which correspondingly trigger the semiconductor component. Reference is made here to Tietze and Schenk, 9th edition, page 523.

DD Patent 228 835 discloses an integrated overtemperature protection circuit arrangement in which bipolar transistors are connected together in such a way that a base-emitter voltage of one transistor is acted upon by a hysteresis, such that with the transistor in the "on" state, a working current is modified by the use of a current level in such a way as to dissipate a current which is less than the working current and is always at a constant ratio to it. This causes the power transistor to be switched on or off as a function of temperature. It is not possible to modulate the power dissipation without switching off. Another disadvantage is that this circuit can be used only in temperature ranges up to approx. 150 degrees C. A semiconductor switch having an overtemperature protector which has a temperature-sensitive element is known from GB-A 2 234 112. The temperature-sensitive element is configured in the form of a diode switched into the off-state direction, and allows the driver current of the semiconductor switch to be shunted if the latter becomes too hot.

SUMMARY OF THE INVENTION

The present invention is advantageous in that temperature-dependent modulation of the power dissipation of a power transistor can be accomplished even for very high temperatures, which may be, for example, approximately 200 degrees C. Because a transistor is provided whose off-state current, which changes as a function of temperature, initiates a change in the base current of the power transistor, it is advantageously possible to effect tolerance-stable regulation of the power transistor at very high temperatures. As a result of the temperature-dependent regulation of the base current of the power transistor, the entire circuit arrangement can be of very simple and therefore economical construction. It is especially advantageous that because the off-state current is used to initiate regulation of the power transistor, controlled modulation of the base current and thus of the power transistor is possible.

DETAILED DESCRIPTION

Figures 1, 1A:
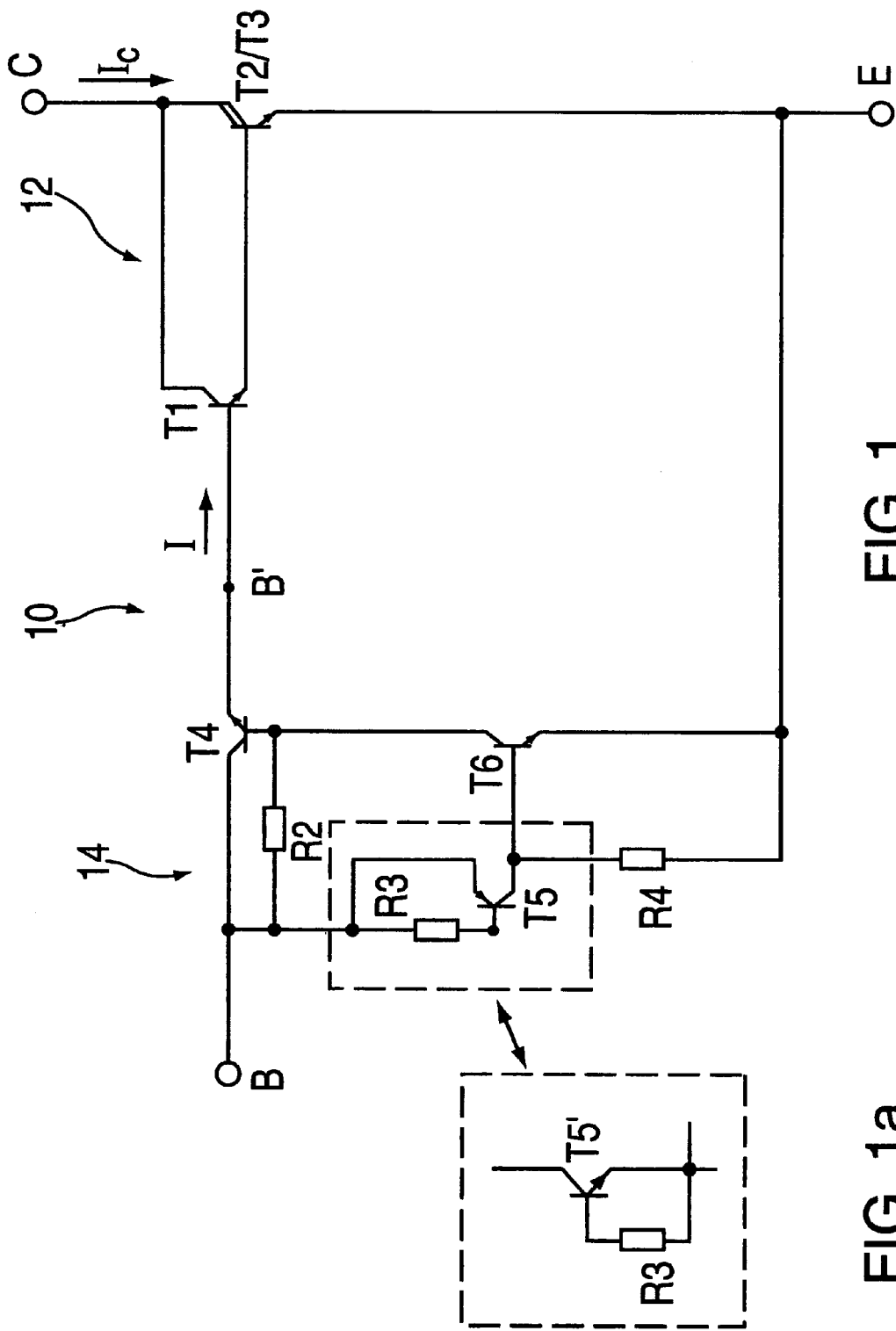
FIG. 1 shows a circuit arrangement of an integrated circuit according to the present invention.
FIG. 1a shows an npn transistor block in place of the pnp transistor block of FIG. 1.

FIG. 1 shows an integrated circuit designated globally as 10. Integrated circuit 10 has a power transistor 12 and a circuit arrangement 14 which are individually configured as follows:

Integrated circuit 10 has a collector terminal C, a base terminal B, and an emitter terminal E. Power transistor 12 is made up of transistors T1, T2, and T3, which are connected in a Darlington circuit. Transistors T1, T2, and T3 are configured as npn transistors.

Circuit arrangement 14 includes transistors T4, T6, and either T5 or T5'. Transistor T5 is a pnp transistor and transistors T4, T5', and T6 are npn transistors.

Base terminal B is connected to the collector of transistor T4. The emitter of transistor T4 is connected to the base of transistor T1. The collectors of transistors T1, T2, and T3 are connected to collector terminal C. The emitter of transistor T1 is connected to the base of transistors T2 and T3. The emitter of transistor T3 is connected to emitter terminal E. The base of transistor T5 (or T5') is connected, via a resistor R3, to the emitter of transistor T5 (or T5'). Resistor R3 is configured as a temperature-dependent resistor with a positive temperature coefficient. The collector of transistor T4 is also connected to the emitter of transistor T5 in the case of a pnp transistor, otherwise to the collector of transistor T5' in the case of an npn transistor (FIG. 1a), and via resistor R2 to the collector of transistor T6. The collector of transistor T6 is also connected to the base of transistor T4. The collector of transistor T5 in the case of the pnp transistor, and otherwise the emitter of transistor T5' in the case of the npn transistor, is connected on the one hand to the base of transistor T6 and on the other hand via resistor R4 to emitter terminal E. The emitter of transistor T6 is also connected to emitter terminal E.

Integrated circuit 10 performs the following function:

When integrated circuit 10 is being used as intended, a load can be switched by means of power transistor 12 between collector terminal C and emitter terminal E. Power transistor 12 is triggered by transistor T4, connected "lengthwise" between base terminal B and the base of transistor T1. The base current I of power transistor 12 can thus be influenced by way of transistor T4. Transistor T5 (or T5') feeds its off-state current $I_{CER}$ into resistor R4 and into the base of T6. Since the base and emitter of T5 (or T5') are connected in low-resistance fashion via R3, a short-circuit occurs for low currents between base and emitter, so that $I_{CER} \approx I_{CES}$ ($I_{CES}$ mode). The result is a current at the base of transistor T6, although it is too small to activate transistor T6.

If heating of integrated circuit 10 then occurs, resulting in particular from power dissipation caused at power transistor 12, the resistance value of resistor R3 increases sharply due to its positive temperature coefficient. Transistor T5 (or T5') thus transitions into its $I_{CEO}$ mode, i.e. the base of transistor T5 behaves approximately as if it were open, so that $I_{CER} \approx I_{CEO}$. Because of the heating of circuit arrangement 14, the resistance value of resistor R3 increases according to a power function, while the off-state current of transistor T5 rises exponentially. At the same time, the base-emitter breakdown voltage of transistor T5 (or T5') decreases at <−2 mV/K. The ensuing much greater off-state current of transistor T5 (or T5'), which is increasing by approx. two orders of magnitude, results in a higher base-emitter voltage $U_{BE}$ of transistor T6, so that the latter is activated. This triggers the base of transistor T4, so that the base current I of power transistor 12 is influenced via transistor T4. It is thus clear that the base current I of power transistor 12 can be influenced by way of the magnitude of the off-state current occurring in transistor T5 (or T5').

The base current I is modulated to a greater or lesser degree depending on the magnitude of the off-state current present, so that a continuous reduction in the power dissipation of power transistor 12 is possible. A continuous rise in the off-state current of transistor T5 (or T5') due to heating causes the base current I of power transistor 12 to diminish to the same degree, so that the latter's power is continuously reduced.

The continuous decrease in the base current of power transistor 12 prevents uncontrolled excess voltages from occurring between collector terminal C and emitter terminal E. This means, especially when power transistor 12 is used to trigger an ignition coil in motor vehicles, that premature ignition events due to uncontrolled excess voltage can be prevented.

Despite the presence of a modulated power transistor 12, the source voltage of the base supply of integrated circuit 10 is present at the collector of transistor T4. The result is that despite the presence of a modulated power transistor 12, circuit arrangement 14, and thus transistor T5 (or T5') connected as a thermal sensor element, has available a sufficient level of driving voltage available. This ensures that circuit arrangement 14 can function regardless of the circuit state of power transistor 12. The voltage $U_{BE}$ between base terminal B and emitter terminal E of the integrated circuit increases with increasing temperature due to the modulation of transistor T4, while the voltage $U_{B'E}$ between point B' and emitter terminal E decreases with increasing temperature.

A capability for modification exists by way of the selection of the value of resistor R3 or its positive temperature coefficient, so that the transition of transistor T5 (or T5') from the $I_{CES}$ mode into the $I_{CEO}$ mode, and thus the resulting point at which thermal modulation of power transistor 12 begins, can be defined. The overall result of this is the ability to effect thermal modulation of power transistor 12 at very high temperatures, which for example can be over 200 degrees C.

Figure 2:
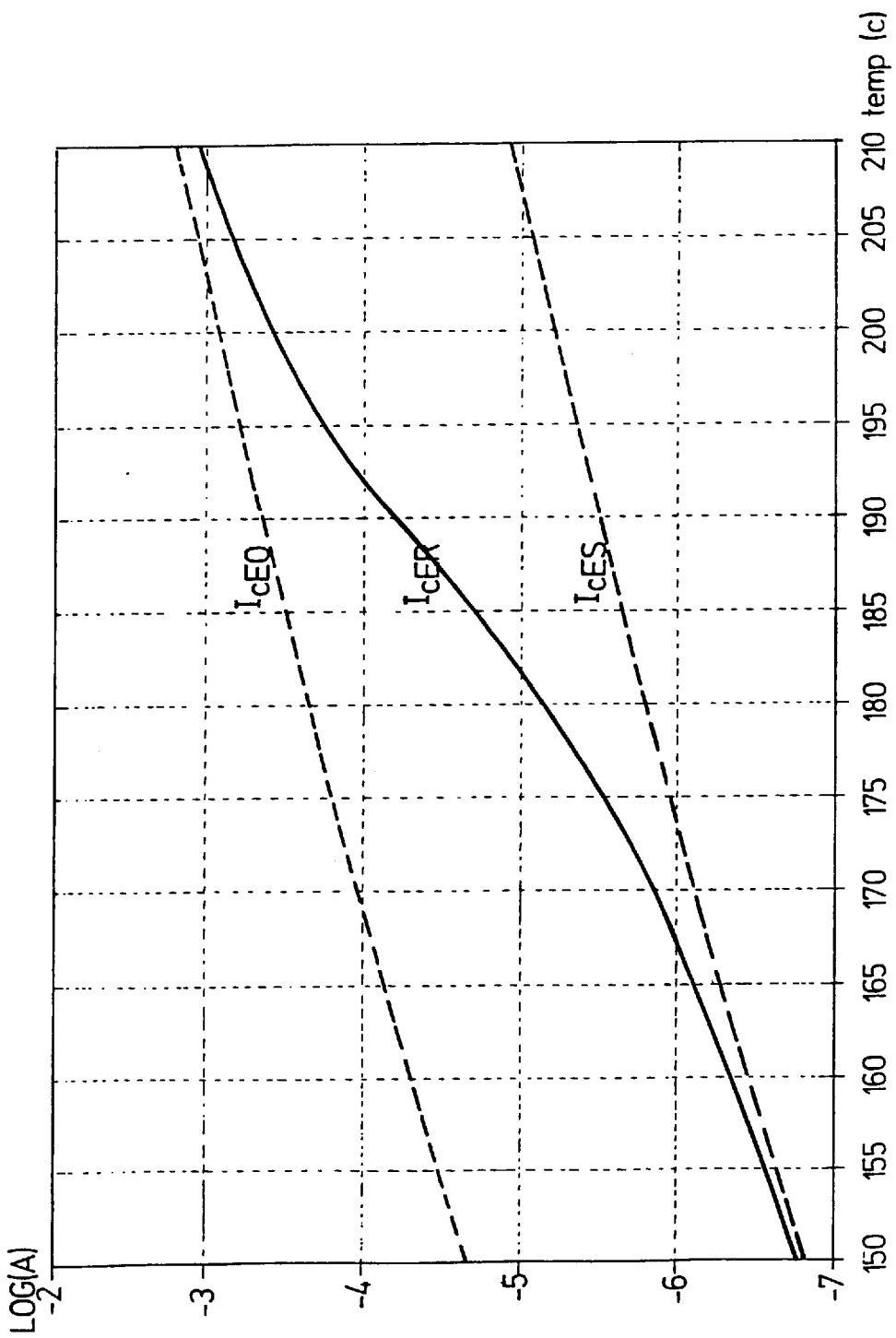
FIG. 2 shows, in a diagram, the behavior of an off-state current as a function of temperature.

FIG. 2 illustrates the transition of off-state current $I_{CER}$ from the $I_{CES}$ mode into the $I_{CEO}$ mode of transistor T5 (or T5'); off-state current $I_{CER}$ is here plotted logarithmically against temperature. It is apparent that as the temperature rises, the off-state current, which is essentially influenced by resistor R3 and designated here as $I_{CER}$, transitions from the $I_{CES}$ mode into the $I_{CEO}$ mode. After a gradual increase in off-state current $I_{CER}$ up to temperatures of approximately 155 degrees C., the latter transitions, with an increasingly steep slope, into the $I_{CEO}$ mode up to temperatures exceeding 200 degrees C. The increase in the slope of the off-state current $I_{CER}$ results in a corresponding positive control of transistor T4, and thus in a corresponding influence on the base current I of power transistor 12.

Figures 3, 3A:
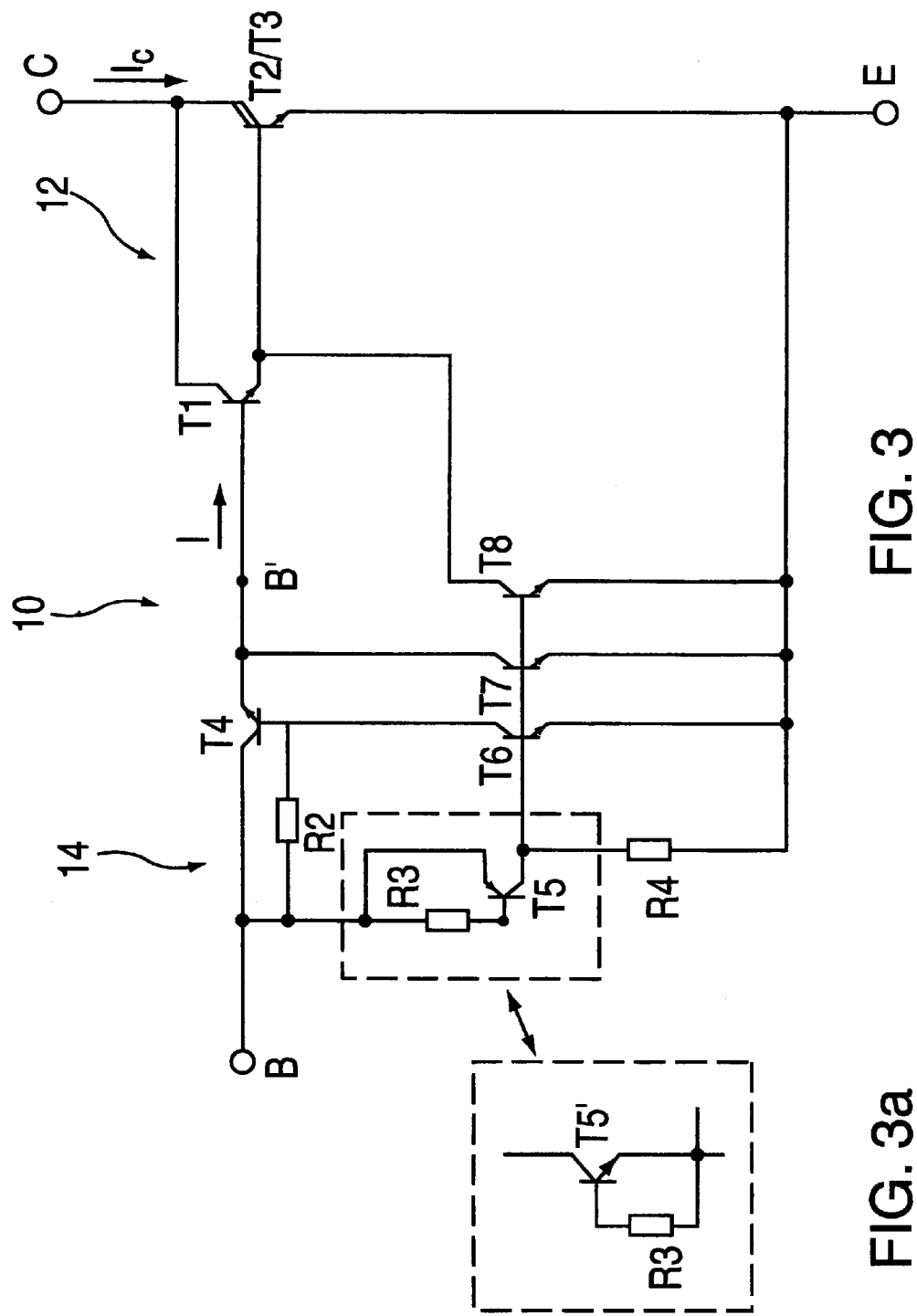
FIG. 3 shows a further embodiment of the circuit arrangement according to the present invention.
FIG. 3a shows an npn transistor block in place of the pnp transistor block in place of the pnp transistor block of FIG. 3.

FIG. 3 shows a further integrated circuit 10 in which parts identical to those in FIG. 1 are given the same reference characters and are not described again. Additionally provided here in circuit arrangement 14 are transistors T7 and T8, each configured as npn transistors. The collector of transistor T5 in the case of a pnp transistor, and the emitter of transistor T5' in the case of an npn transistor (FIG. 3a), is here connected not only to the base of transistor T6 but also simultaneously to the base of transistor T7 and the base of transistor T8. The collector of transistor T7 is connected to the base of transistor T1. The collector of transistor T8 is connected to the emitter of transistor T1. The emitters of transistors T7 and T8 are connected to emitter terminal E.

Figure 4A:
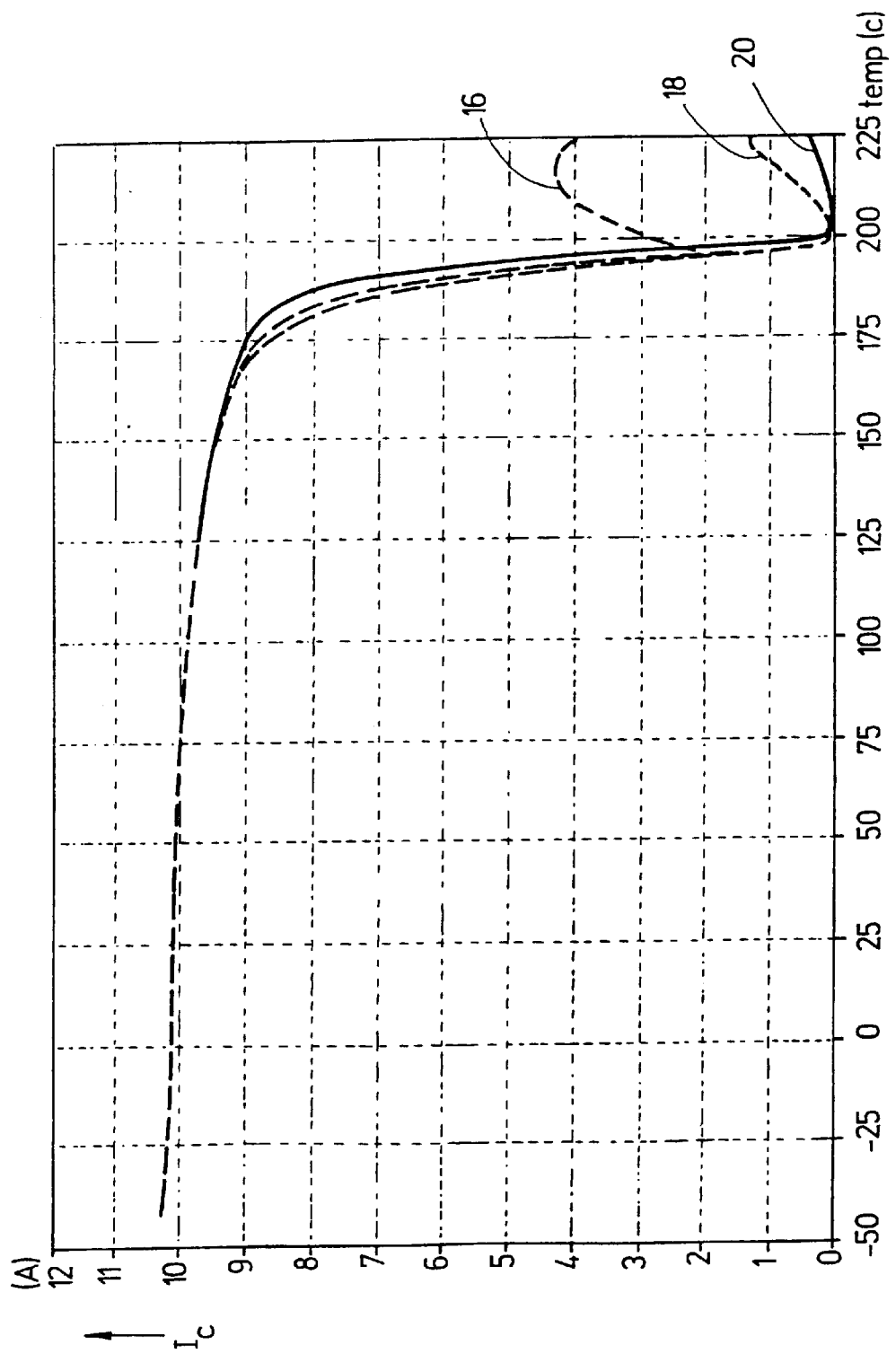
FIG. 4a shows a first diagram of the regulating current of the circuit arrangement as a function of temperature.
Figure 4B:
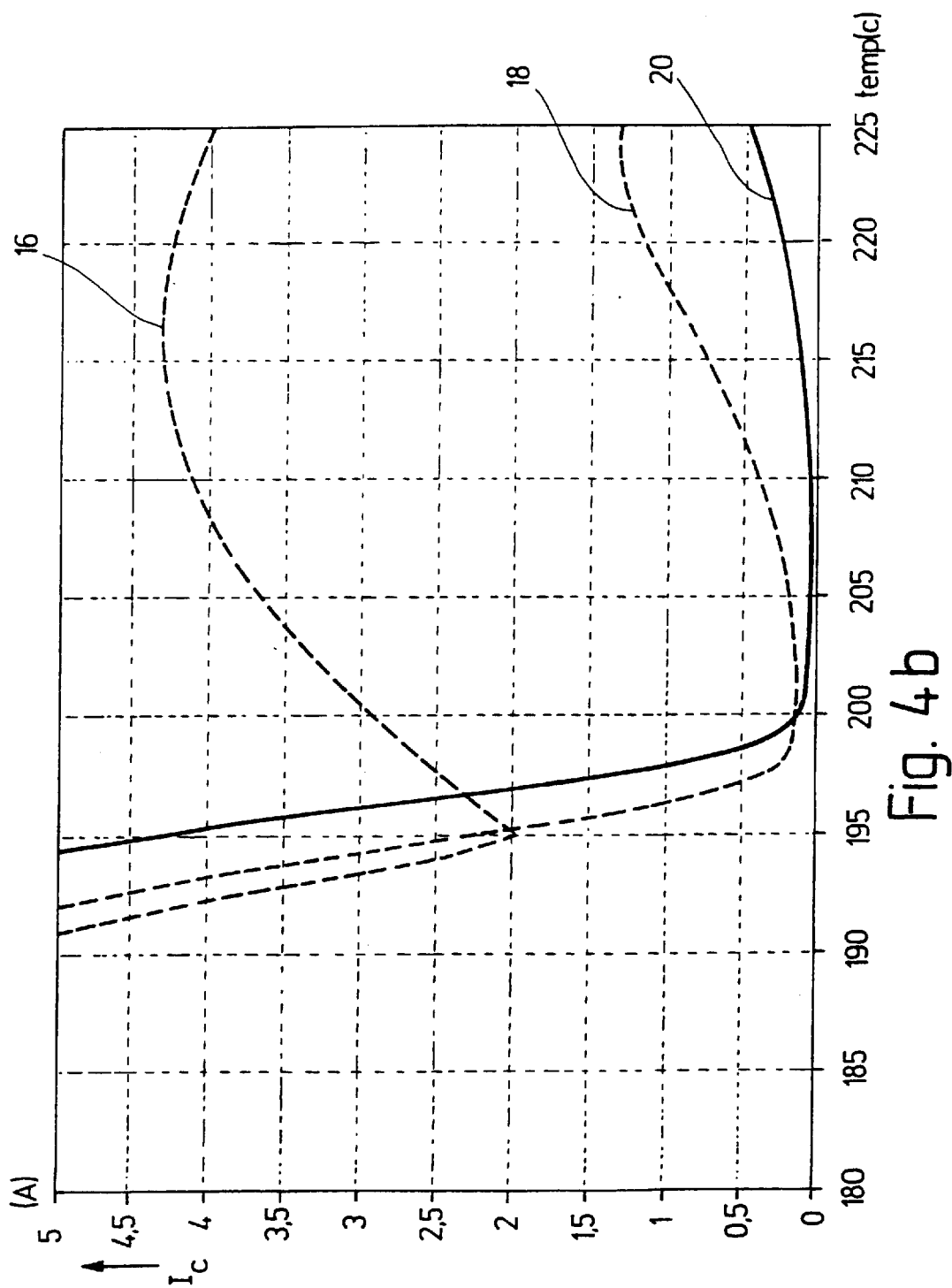
FIG. 4b shows a second diagram of the regulating current of the circuit arrangement as a function of temperature.

The additional transistors T7 and T8 are also triggered by the off-state current of transistor T5 (or T5'). Triggering of transistors T7 and T8 again occurs only at the working point of transistor T5 (or T5'), i.e. when the latter, due to rising temperature, transitions from the $I_{CES}$ mode into the $I_{CEO}$ mode. The fact that transistors T7 and T8 are present in the emitter circuit means that as the off-state current of transistor T5 (or T5')rises (corresponding to a rising base current of transistors T7 and T8), the collector-emitter voltage $U_{CE}$ of transistors T7 and T8 rises. Transistors T7 and T8 thus provide "thermal clearing," influencing the modulation of the base current I of power transistor 12 especially at high temperatures. The resulting different characteristic curves for the collector voltage $I_C$ of the overall circuit are depicted in FIGS. 4a and 4b using simulated curves. FIG. 4b shows an enlargement of a portion of the curves in FIG. 4a in the higher-temperature range.

A total of three curves are depicted, illustrating the behavior of collector current $I_C$ as a function of temperature. A first curve 16 reproduces the behavior corresponding to the circuit arrangement shown in FIG. 1. As the temperature rises, the collector current $I_C$ decreases, for example from a value of 10 A to a value of approximately 2 A at approx. 195 degrees C., and then increases again with rising temperature due to the so-called "thermal drift" of power transistor 12. A second curve 18 illustrates the behavior of collector current $I_C$ when transistor T7 is additionally inserted. In addition to the much greater drop in collector current $I_C$ to values below 500 mA, the onset of "thermal drift" in power transistor 12 is displaced to a higher temperature of approximately 200 degrees C. At the same time, there is much less of an increase in collector current $I_C$ at the higher temperatures. A third curve 20 shows the behavior of collector current $I_C$ when transistors T6, T7, and T8 are simultaneously triggered by the off-state current of transistor T5 (or T5'). A further shift, to higher temperatures of approximately 210 degrees C., occurs in the onset of "thermal drift" in power transistor 12; the temperature rise is once again clearly limited. Modulation of the collector current $I_C$ of power transistor 12 can thus be displaced to temperatures well above 200 degrees C.

What is claimed is:

1. An integrated circuit comprising:
   a base terminal;
   a power transistor having a base and a base current; and
   a circuit arrangement coupled to the power transistor and operating in a temperature-dependent fashion, the circuit arrangement including:
   a first pnp transistor having a base, a collector and an emitter, the first pnp transistor having an off-state current changing as a function of temperature and initiating a change in the base current of the power transistor, a temperature-dependent resistor coupled between the base and the emitter of the first pnp transistor, the temperature-dependent resistor having a positive temperature coefficient, and a second transistor having a collector and an emitter through which the base current of the power transistor flows, the collector of the second transistor being coupled to the base terminal of the integrated circuit and to the emitter of the first pnp transistor, the emitter of the second transistor being coupled to the base of the power transistor.

2. The integrated circuit according to claim 1, wherein the second transistor is triggered by a third transistor, the third transistor having a base, the base of the third transistor being coupled to the collector of the first pnp transistor.

3. The integrated circuit according to claim 2, wherein the integrated circuit has an emitter terminal.

4. The integrated circuit according to claim 3, wherein the circuit arrangement further includes a second resistor coupled to the collector of the first pnp transistor and to the emitter terminal of the integrated circuit.

5. The integrated circuit according to claim 4, wherein the circuit arrangement further includes a fourth transistor having a base, a collector and an emitter, the base of the fourth transistor being coupled to the collector of the first pnp transistor, the collector of the fourth transistor being coupled to the base of the power transistor, the emitter of the fourth transistor being coupled to the emitter terminal of the integrated circuit.

6. The integrated circuit according to claim 5, wherein the power transistor includes a Darlington circuit having a fifth transistor and a sixth transistor, the fifth transistor having a base, a collector and an emitter, the sixth transistor having a base, a collector and an emitter.

7. The integrated circuit according to claim 6, wherein the circuit arrangement further includes a seventh transistor having a base, a collector and an emitter, the base of the seventh transistor being coupled to the collector of the first pnp transistor, the collector of the seventh transistor being coupled to the emitter of the fifth transistor, the emitter of the seventh transistor being coupled to the emitter terminal of the integrated circuit.

8. An integrated circuit comprising:

a base terminal;

a power transistor having a base and a base current;

a circuit arrangement coupled to the power transistor and operating in a temperature-dependent fashion, the circuit arrangement including:

a first npn transistor having a base, a collector and an emitter, the first npn transistor having an off-state current, the off-state current changing as a function of temperature and initiating a change in the base current of the power transistor, a temperature-dependent resistor coupled between the base and the emitter of the first npn transistor, the temperature-dependent resistor having a positive temperature coefficient, and a second transistor having a collector and an emitter through which the base current of the power transistor flows, the collector of the second transistor being coupled to the base terminal of the integrated circuit and the collector of the first npn transistor, the emitter of the second transistor being coupled to the base of the power transistor.

9. The integrated circuit according to claim 8, wherein the second transistor is triggered by a third transistor, the third transistor having a base, the base of the third transistor being coupled to the emitter of the first npn transistor.

10. The integrated circuit according to claim 9, wherein the integrated circuit has an emitter terminal.

11. The integrated circuit according to claim 10, wherein the circuit arrangement further includes a second resistor coupled to the emitter of the first npn transistor and to the emitter terminal of the integrated circuit.

12. The integrated circuit according to claim 11, wherein the circuit arrangement further includes a fourth transistor having a base, a collector and an emitter, the base of the fourth transistor being coupled to the emitter of the first npn transistor, the collector of the fourth transistor being coupled to the base of the power transistor, the emitter of the fourth transistor being coupled to the emitter terminal of the integrated circuit.

13. The integrated circuit according to claim 12, wherein the power transistor includes a Darlington circuit having a fifth transistor and a sixth transistor, the fifth transistor having a base, a collector and an emitter, the sixth transistor having a base, a collector and an emitter.

14. The integrated circuit according to claim 13, wherein the circuit arrangement further includes a seventh transistor having a base, a collector and an emitter, the base of the seventh transistor being coupled to the emitter of the first npn transistor, the collector of the seventh transistor being coupled to the emitter of the fifth transistor, the emitter of the seventh transistor being coupled to the emitter terminal of the integrated circuit.

* * * * *